(12) United States Patent
Ishizaka et al.

(10) Patent No.: US 9,368,418 B2
(45) Date of Patent: Jun. 14, 2016

(54) COPPER WIRING STRUCTURE FORMING METHOD

(71) Applicant: Tokyo Electron Limited, Tokyo (JP)

(72) Inventors: Tadahiro Ishizaka, Yamanashi (JP); Kenji Suzuki, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/464,684

(22) Filed: Aug. 20, 2014

(65) Prior Publication Data

US 2015/0056385 A1 Feb. 26, 2015

(30) Foreign Application Priority Data

Aug. 22, 2013 (JP) ................ 2013-172492

(51) Int. Cl.
*H01L 21/768* (2006.01)
*H01L 23/00* (2006.01)
*C23C 14/16* (2006.01)
*C23C 14/35* (2006.01)
*H01J 37/34* (2006.01)
*H01J 37/32* (2006.01)
*H01L 21/285* (2006.01)
*H01L 23/532* (2006.01)

(52) U.S. Cl.
CPC ............ *H01L 23/00* (2013.01); *C23C 14/165* (2013.01); *C23C 14/358* (2013.01); *H01J 37/32899* (2013.01); *H01J 37/34* (2013.01); *H01J 37/3429* (2013.01); *H01L 21/76843* (2013.01); *H01L 21/76847* (2013.01); *H01L 21/76849* (2013.01); *H01L 21/76858* (2013.01); *H01L 21/76876* (2013.01); *H01L 21/76877* (2013.01); *H01L 21/76883* (2013.01); *H01L 23/53238* (2013.01); *H01L 21/2855* (2013.01); *H01L 23/53233* (2013.01); *H01L 2924/0002* (2013.01)

(58) Field of Classification Search
None
See application file for complete search history.

(56) References Cited

U.S. PATENT DOCUMENTS 6,777,332 B2 8/2004 Harada
7,799,681 B2 9/2010 Suzuki et al.
(Continued)

FOREIGN PATENT DOCUMENTS

JP 07-012305 1/1995
JP 2006-148075 6/2006
(Continued)

OTHER PUBLICATIONS

Nogami, T. et al. "High Reliability 32 nm Cu/ULK BEOL Based on PVD CuMn Seed, and its Extendibility," IEDM10 33.5 (2010): 764-767.

(Continued)

*Primary Examiner* — Cheung Lee

(57) ABSTRACT

In a Cu wiring structure forming method, a barrier film serving as a Cu diffusion barrier is formed at least on a surface of a recess in a first insulating film formed on a substrate, and the recess is filled with an Al-containing Cu film. A Cu wiring is formed from the Al-containing Cu film, and a cap layer including a Ru film is formed on the Cu wiring. Further, an interface layer containing a Ru—Al alloy is formed at an interface between the Cu wiring and the cap layer by heat generated in forming the cap layer or by a heat treatment performed after forming the cap layer. A second insulating film is formed on the cap layer.

18 Claims, 8 Drawing Sheets

(56) References Cited

U.S. PATENT DOCUMENTS

| | | |
|---|---|---|
| 8,247,030 B2 | 8/2012 | Suzuki et al. |
| 8,399,353 B2 | 3/2013 | Ishizaka et al. |
| 9,101,067 B2 | 8/2015 | Ishizaka et al. |
| 2002/0081844 A1 | 6/2002 | Jeon et al. |
| 2008/0200002 A1 | 8/2008 | Suzuki et al. |
| 2009/0263965 A1 | 10/2009 | Gordon et al. |
| 2010/0081274 A1 | 4/2010 | Ishizaka et al. |
| 2012/0114869 A1 | 5/2012 | Miyoshi et al. |
| 2013/0273250 A1 | 10/2013 | Fujimura et al. |
| 2014/0292166 A1 | 10/2014 | Hwang et al. |

FOREIGN PATENT DOCUMENTS

| | | |
|---|---|---|
| JP | 2011-023456 | 2/2011 |
| JP | 2012-504347 | 2/2012 |
| KR | 10-2013-0077994 | 7/2013 |
| WO | 2012-060428 | 5/2012 |

OTHER PUBLICATIONS

Shusuke, Miyoshi, et al.; Deposition Method; Abstract of JP 2011-023456; Feb. 3, 2011; http://www19.ipdl.inpit.go.jp/.

Suzuki, Kenji, et al.; Method of Depositing Film and Device for Plasma Deposing Film; Abstract of JP 2006-148075; Jun. 8, 2006; http://www19.ipdl.inpit.go.jp/.

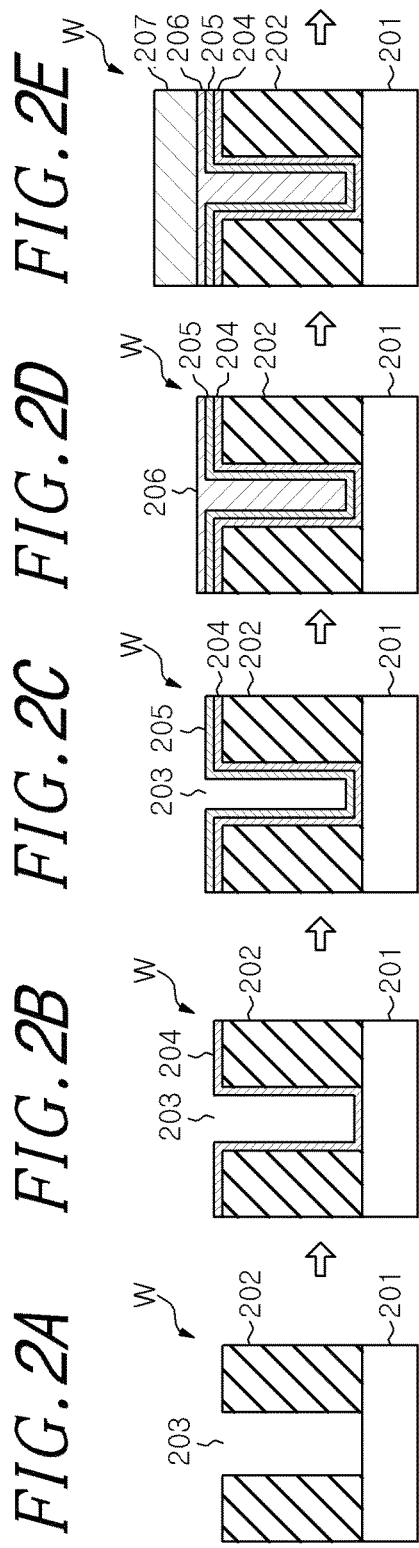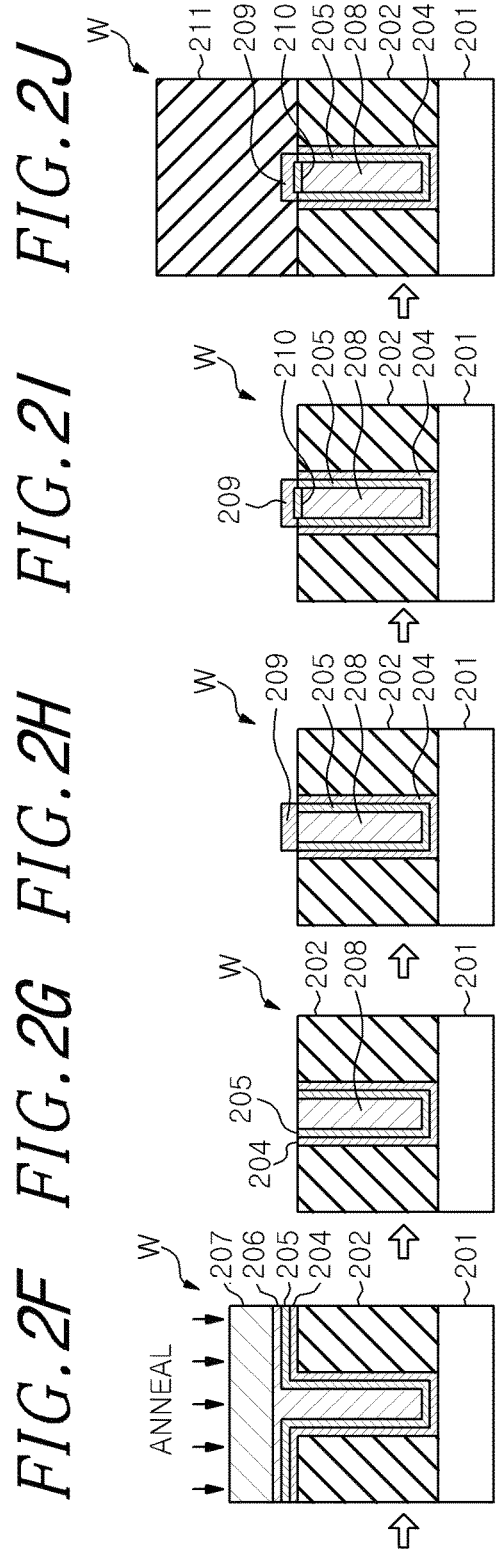

FIG.8

| | Ru 1nm / TaN 2nm | Ru 1nm / TaN 1nm | Ru 3nm |
|---|---|---|---|
| Cu | | | |
| CuAl | | | |

COPPER WIRING STRUCTURE FORMING METHOD

CROSS-REFERENCE TO RELATED APPLICATIONS

This application claims priority to Japanese Patent Application No. 2013-172492 filed on Aug. 22, 2013, the entire contents of which are incorporated herein by reference.

FIELD OF THE INVENTION

The present invention relates to a copper (Cu) wiring structure forming method for forming a copper wiring in a recess formed in an insulating film on a substrate and forming an upper insulating film on the Cu wiring via a cap layer.

BACKGROUND OF THE INVENTION

In order to manufacture a desired semiconductor device, various processes such as a film formation, an etching and the like are repeatedly performed on a semiconductor wafer. Recently, in order to meet demands for high-speed semiconductor device, miniaturization of a wiring pattern and high level of integration, it is required to realize low resistance (high conductivity) of a wiring and high electromigration resistance.

Accordingly, copper (Cu) having a higher electromigration resistance and a higher conductivity (lower resistance) than aluminum (Al) and tungsten (W) used as a wiring material.

As for the Cu wiring structure forming method, there is proposed a method including: forming a barrier film formed of tantalum metal (Ta), titanium (Ti), tantalum nitride (TaN), titanium nitride (TiN) or the like on an entire interlayer insulating film having a trench and/or a hole by a plasma sputtering as an example of a physical vapor deposition (PVD); forming a Cu seed film on the barrier film by the plasma sputtering; filling the trench and/or the hole by performing a Cu plating; and removing a residual Cu thin film or a residual barrier film remaining on the wafer surface by a chemical mechanical polishing (CMP). Then, a cap layer made of a dielectric material such as silicon carbonitride (SiCN), silicon nitride (SiN) or the like is formed on the Cu wiring and thereafter an upper interlayer insulating film is formed (e.g., Japanese Patent Application Publication No. 2006-148075).

However, as a design rule for scaling-down of the aforementioned semiconductor device progresses and a current density is thus increased, the electromigration resistance is not sufficient even when using Cu as the wiring material. Particularly, the electromigration deterioration in the Cu wiring is easily caused by insufficient adhesion between the Cu wiring and a dielectric cap provided thereon.

In view of the above, as for a new technique for improving reliability of a wiring by improving electromigration resistance, there is proposed a wiring forming method using a Cu alloy (Cu—Al, Cu—Mn, Cu—Mg, Cu—Ag, Cu—Sn, Cu—Pb, Cu—Zn, Cu—Pt, Cu—Au, Cu—Ni, Cu—Co or the like) for a seed layer instead of a Cu seed film (e.g., Nogami et. al. IEDM2010 pp 764-767). The alloy component is segregated between the Cu wiring and a dielectric cap (SiCN cap) formed thereon, thereby improving adhesivity therebetween. Accordingly, the electromigration resistance can be improved. The electromigration resistance can also be improved by the segregation of the alloy component of the Cu alloy at grain boundaries of Cu.

In addition, there is proposed a technique for improving electromigration resistance by improving adhesivity between Cu and a dielectric cap by selectively forming a metal cap on a surface of a Cu wiring (e.g., Japanese Patent Application Publication No. 2011-023456 (JP2011-023456A), U.S. Pat. No. 7,799,681 (U.S. Pat. No. 7,799,681B), Japanese Patent Application Publication No. 2012-504347 (JP2012-504347A)).

Meanwhile, in the Cu wiring structure, a Low-k film having a low dielectric constant of about 2.5 is used as a lower interlayer insulating film in order to suppress a resistance-capacitance (RC) delay which is a product of a resistance R of the wiring (line resistance) and a capacitance C between the wirings (line-to-line capacitance). However, in the technique described in Nogami et. al. IEDM2010 pp 764-767, it is difficult to reduce the RC delay because SiCN or the like forming the dielectric cap has a high dielectric constant of about 5 and, thus, an effective dielectric constant of the wiring structure including the cap layer is increased.

In the case of forming the metal cap on the Cu wiring as described in JP2011-023456A, U.S. Pat. No. 7,799,681B, and JP2012-504347A, the metal cap needs to be selectively formed on the Cu wiring in order to reduce a leakage current between wirings. For this reason, the number of processes is increased to ensure the selectivity, so that costs are increased. The metal cap formed by such a technique has poor oxygen barrier characteristics and, thus, moisture in the upper interlayer insulating film or oxygen·moisture in the atmosphere reaches the Cu wiring. Hence, the Cu wiring is oxidized, which causes the electromigration deterioration. Therefore, in order to ensure the barrier characteristics, the dielectric cap is required, and therefore the effective dielectric constant of the wiring structure cannot be reduced.

SUMMARY OF THE INVENTION

In view of the above, the present invention provides a Cu wiring structure forming method for forming a Cu wiring in a recess formed in an insulating film on a substrate and then forming an upper insulating film on the Cu wiring via a cap layer, which is capable of suppressing an increase of a dielectric constant of the wiring structure, improving oxygen barrier characteristics to the Cu wiring, increasing selectivity of the cap film to the Cu film and improving electromigration resistance of the Cu wiring.

In accordance with an embodiment of the present invention, there is provided a Cu wiring structure forming method, including: providing a first insulating film having a recess on a substrate; forming a barrier film serving as a Cu diffusion barrier at least on a surface of the recess of the first insulating film on a substrate; filling the recess with an Al-containing Cu film; forming a Cu wiring from the Al-containing Cu film; forming a cap layer including a Ru film on the Cu wiring; forming an interface layer containing a Ru—Al alloy at an interface between the Cu wiring and the cap layer by heat generated in forming the cap layer or by a heat treatment performed after forming the cap layer; and forming a second insulating film on the cap layer.

BRIEF DESCRIPTION OF THE DRAWINGS

The objects and features of the present invention will become apparent from the following description of embodiments, given in conjunction with the accompanying drawings, in which:

FIGS. 2A to 2J are process cross sectional views for explaining the Cu wiring structure forming method in accordance with the embodiment of the present invention;

FIG. 8 shows microscope images obtained after annealing is performed on a plurality of samples, each having a structure shown in FIG. 7, at a temperature of 180° C. for 2 hours in the atmospheric environment.

DETAILED DESCRIPTION OF THE EMBODIMENTS

Hereinafter, an embodiment of the present invention will be described in detail with reference to the accompanying drawings, which forms a part hereof.

<Embodiment of Cu Wiring Structure Forming Method>

Figure 1:
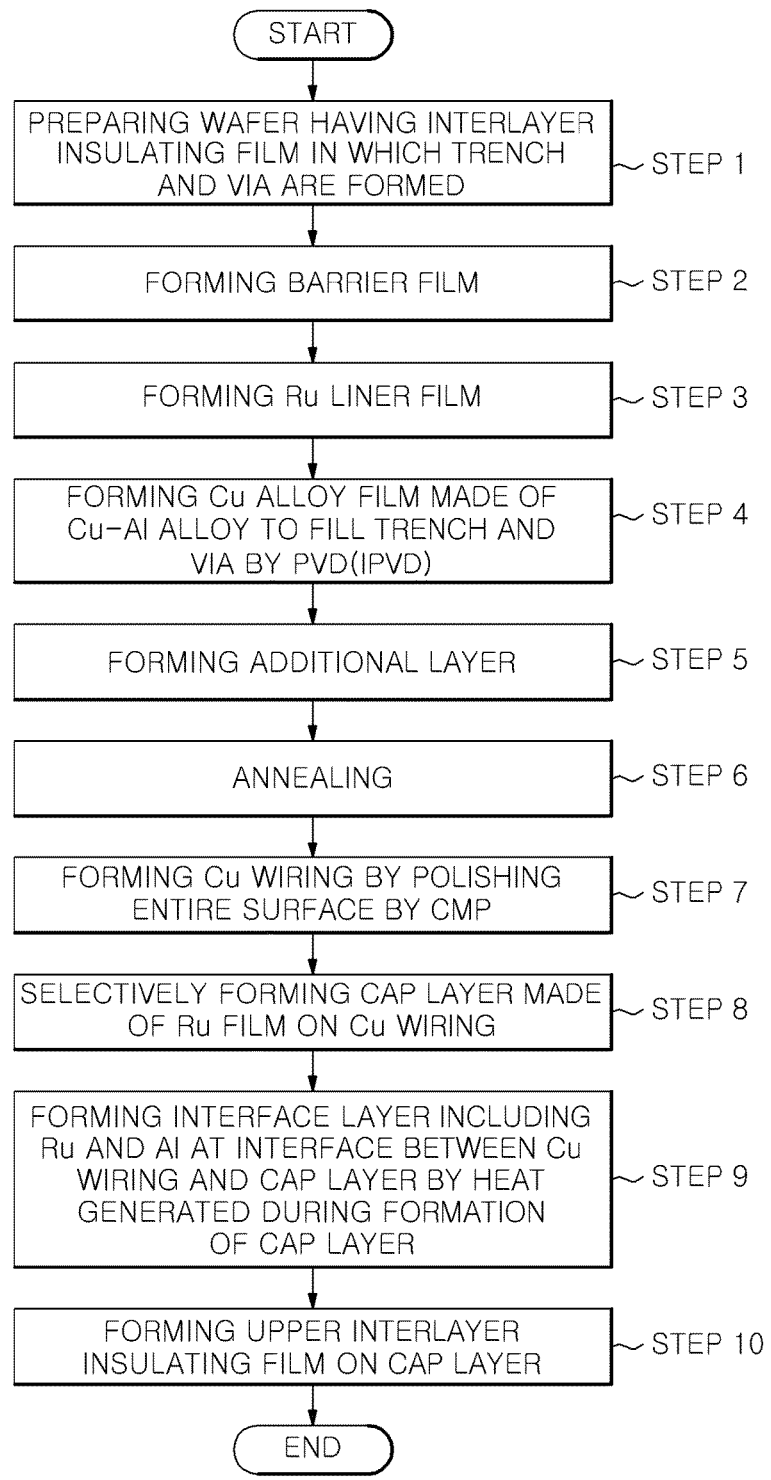
FIG. 1 is a flowchart showing a Cu wiring structure forming method in accordance with an embodiment of the present invention.

A Cu wiring structure forming method in accordance with an embodiment of the present invention will be described with reference to a flowchart of FIG. 1 and process cross sectional views shown in FIGS. 2A to 2J.

In the present embodiment, first, there is prepared a semiconductor wafer W (hereinafter, simply referred to as "wafer") including: a base structure 201 having an underlying Cu wiring (whole detailed configuration is not shown); an interlayer insulating film 202, such as a $SiO_2$ film, a Low-k film (SiCO, SiCOH or the like) or the like, formed on the base structure 201; and a trench 203 and a via (not shown) for connection to the underlying Cu wiring, formed in a predetermined pattern (step 1, FIG. 2A). As for the wafer W, it is preferable to remove etching/asking residue or moisture from a surface of an insulating film by a degas process or a pre-clean process. In addition, in order to reduce a resistance-capacitance (RC) delay, it is preferable to use a Low-k film for the interlayer insulating film 202.

Next, a barrier film 204 for suppressing diffusion of Cu by shielding Cu (acting as a barrier against Cu) is formed on the entire surface including the surfaces of the via and the trench 203 (step 2, FIG. 2B).

As for the barrier film 204, it is preferable to use a film having a high barrier property and a low resistance, e.g., a Ti film, a TiN film, a Ta film, a TaN film, or a Ta/TaN bilayered film. It is also possible to use a TaCN film, a W film, a WN film, a WCN film, a Zr film, a ZrN film, a V film, a VN film, an Nb film, an NbN film or the like. The resistance of the Cu wiring becomes lower as the volume of Cu filled in the trench or the hole is increased. Therefore, the barrier film preferably has a considerably thin thickness in a range from 1 nm to 20 nm, and more preferably in a range from 1 nm to 10 nm. The barrier film can be formed by ionized physical vapor deposition (iPVD), e.g., a plasma sputtering. The barrier film can also be formed by another physical vapor deposition (PVD) such as a conventional sputtering, an ion plating or the like, a chemical vapor deposition (CVD), an atomic layer deposition (ALD)), a plasma CVD or a plasma ALD.

Next, a Ru liner film 205 is formed on the barrier film 204 (step 3, FIG. 2C). The Ru liner film preferably has a thin thickness in a range from e.g., 1 nm to 5 nm in order to realize a low resistance of the wiring by increasing the volume of Cu to be filled.

Since Ru has high wettability to Cu, forming the Ru liner film at the base of Cu ensures good mobility of Cu in forming a Cu film by using iPVD, and it becomes possible to suppress to form an overhang which blocks an opening of the trench or the hole. Therefore, Cu can be reliably filled even in a fine trench or hole without forming a void therein.

The Ru liner film is preferably formed by thermal CVD while using $Ru_3(CO)_{12}$ as a film forming material. Accordingly, a thin Ru film having high purity can be formed with a high step coverage. The film forming conditions are as follows: a pressure in the processing chamber ranging from 1.3 Pa to 66.5 Pa; and a film forming temperature (wafer temperature) ranging from 150° C. to 250° C. The Ru liner film 205 may be formed by the CVD using another film forming material other than $Ru_3(CO)_{12}$, such as a ruthenium pentadienyl compound, e.g., (cyclopentadienyl)(2,4-dimethylpentadienyl)ruthenium, bis(cyclopentadienyl)(2,4-methylpentadienyl)ruthenium, (2,4-dimethylpentadienyl)(ethylcyclopentadienyl)ruthenium, or bis(2,4-methylpentaenyl)(ethylcyclopentadienyl)ruthenium. The Ru liner film may also be formed by the PVD.

Further, when the opening of the trench or the via is wide and an overhang is hardly formed, the Cu film may be directly formed on the barrier film without forming the Ru liner film 205.

Next, a Cu alloy film 206 made of a Cu—Al alloy is formed by the PVD to fill the Cu—Al alloy in the trench 203 and the via (not shown) (step 4, FIG. 2D). The film formation at this time is preferably performed by the iPVD, e.g., the plasma sputtering.

In the conventional film formation using PVD, the overhang that blocks the opening of the trench or the hole is easily formed due to agglomeration of Cu. However, when the iPVD is used to control the film formation by Cu ions and the etching by ions (Ar ions) of the plasma generation gas while adjusting the bias power applied to the wafer, the formation of the overhang can be suppressed due to the moving Cu. As a consequence, good fillability can be obtained even in a trench or a hole having a narrow opening. At this time, it is preferable to perform a high-temperature process (in a temperature ranging from 65° C. to 350° C., more particularly, from 230° C. to 300° C.) in which Cu is migrated in order to ensure mobility of Cu and obtain good fillability. By performing the film formation using the PVD at such a high temperature, Cu crystal grains can grow, thereby reducing the resistance of the Cu wiring. Further, as described above, by providing the Ru liner film 205 having high wettability to Cu at the base of the Cu alloy film 206, Cu moves without agglomeration on the Ru liner film. Accordingly, the formation of overhang can be suppressed even in a fine recess, and Cu can be reliably filled therein without forming a void.

In this process, when the opening width of the trench or the hole is small, the Cu alloy can be filled therein almost completely. However, when the opening width is large, a few recesses may be formed.

Further, a pressure in the processing chamber (processing pressure) during the formation of the Cu alloy film is preferably in a range from 0.133 Pa to 13.3 Pa (from 1 mTorr to 100 mTorr) and more preferably in a range from 4.66 Pa to 12.0 Pa (from 35 mTorr to 90 mTorr).

Al concentration in the Cu—Al alloy forming the Cu alloy film 206 is preferably in a range from 0.05 at. % to 2 at. %.

The Cu alloy film 206 is formed by using a Cu alloy target made of a Cu—Al alloy. The relationship between a composition (Al concentration) of the target and a composition (Al concentration) of the formed Cu—Al alloy film is changed depending on film forming conditions such as a pressure and the like. Therefore, the composition of the Cu—Al alloy forming the target needs to be adjusted in order to obtain a desired composition under actually employed manufacturing conditions. A DC current applied to the Cu alloy target is preferably in a range from 4 kW to 12 kW and more preferably in a range from 6 kW to 10 kW.

After the Cu alloy is filled in the trench 203 and the via (hole), an additional layer 207 for a planarization process is formed on the Cu alloy film 206 (step 5, FIG. 2E).

The additional layer 207 may be obtained by forming the same Cu—Al alloy film on the Cu alloy film 206 by the PVD such as the iPVD or the like, or by forming a pure Cu film by the PVD or the plating. However, in view of obtaining a good throughput and simplifying the apparatus, it is preferable to form the additional layer 207 made of the same Cu—Al alloy film as the Cu alloy film 206 by using the same PVD (iPVD) apparatus used for forming the Cu alloy film 206. In the case of using the PVD, it is preferable to form the additional layer 207 at a higher forming rate compared to the case of forming the Cu alloy film 206. This is because there is no need to consider the fillability in forming the additional layer 207.

Upon completion of forming the additional layer 207, an annealing process is performed if necessary (step 6, FIG. 2F). The Cu alloy film 206 is stabilized by this annealing process.

Next, the entire surface (top surface) of the wafer W is polished by the CMP and is planarized by removing the additional layer 207, the Cu alloy film 206, the Ru liner film 205, and the barrier film 204 (step 7, FIG. 2G). Accordingly, the Cu wiring 208 made of the Cu—Al alloy is formed in the trench and the via (hole).

Thereafter, if necessary, the degas process is performed to remove moisture, which is absorbed in the interlayer insulating film 202 due to the CMP, and, then, a cap layer 209 made of a Ru film is selectively formed on the Cu wiring 208 (step 8, FIG. 2H). The cap layer 209 is preferably formed by the CVD under the conditions same as those applied to the Ru liner film 205. The cap layer 209 may also be formed by the PVD. The cap layer 209 preferably An interface layer 210 is formed at the interface between the Cu wiring 208 and the cap layer 209 by heat generated during the formation of the cap layer 209 made of the Ru film (step 9, FIG. 2I). An annealing process may be separately performed to form the interface layer 210.

Figure 3:
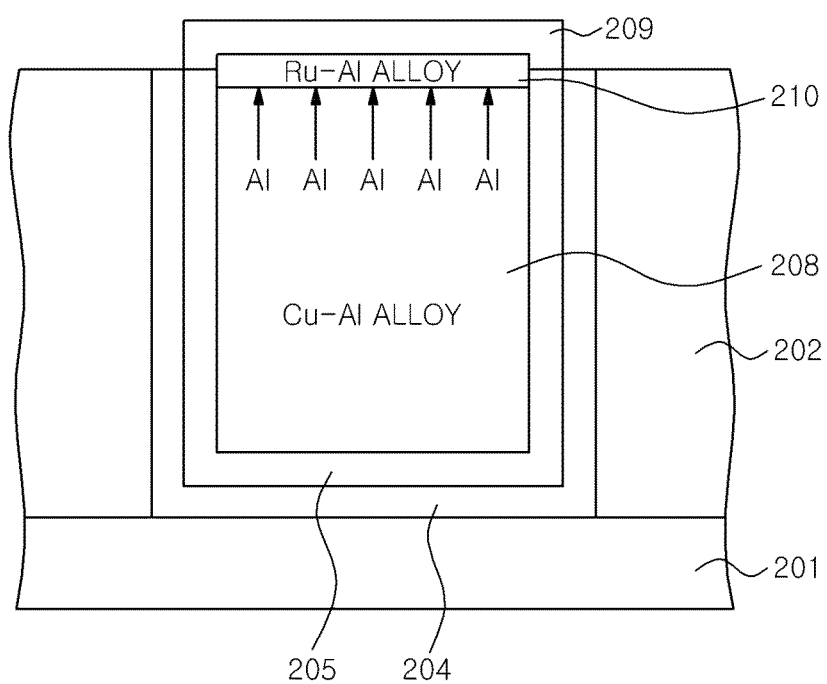
FIG. 3 is a schematic diagram showing a state in which an interface layer is formed by diffusion of Al in a Cu—Al alloy film forming a Cu wiring between the Cu wiring and a cap layer made of a Ru film.

A mechanism of the formation of the interface layer 210 will be described with reference to FIG. 3. The cap layer 209 made of the Ru film is preferably formed by the CVD. At this time, heating is executed at a temperature ranging from 150° C. to 250° C., and Al in the Cu—Al alloy forming the Cu wiring 208 is diffused toward the interface between the Cu wiring 208 and the cap layer 209 by the heat generated at that time. Accordingly, the interface layer 210 containing Ru and Al is formed at the interface therebetween. In the interface layer 210, Ru and Al react with each other to form a Ru—Al alloy. The alloy referred herein includes an intermetallic compound as well as a solid solution.

The Ru—Al alloy in the interface layer 210 has oxygen barrier characteristics and thus prevents transmission of moisture in an upper interlayer insulating film thereon or oxygen·moisture in the atmospheric environment.

Accordingly, the electromigration deterioration in the Cu wiring 208 can be prevented. The Ru—Al alloy also serves as a Cu diffusion barrier and, thus, a dielectric cap that has been conventionally provided to ensure the barrier characteristics of the Cu wiring becomes unnecessary. Although it is not illustrated, the interface layer containing the Ru—Al alloy is also formed between the Ru liner film 205 and the Cu wiring 208.

Since the oxygen barrier characteristics can be ensured by the interface layer 210, the upper interlayer insulating film 211 is formed after the formation of the cap layer 209 without forming the dielectric cap (step 10, FIG. 2J). The upper interlayer insulating film 211 as well as the interlayer insulating film 202 may be made of an $SiO_2$ film or a Low-k film. In view of reduction of the RC delay, the upper interlayer insulating film 211 is preferably made of the Low-k film.

After the upper interlayer insulating film 211 is formed, an upper Cu wiring is formed in the above-described manner.

As described above, in accordance with the present embodiment, the cap layer 209 made of the Ru film that is a metal cap having good adhesivity to the Cu wiring is formed on the Cu wiring 208, so that the electromigration resistance of the Cu wiring can be improved. The Ru film for the cap layer 209 has high wettability to Cu, and incubation time for formation of the Ru film on the Cu wiring 208 is considerably shorter than that on the interlayer insulating film 202. Therefore, the cap layer 209 made of the Ru film can be selectively formed only on the Cu wiring 208 without any specific process. Further, since the interface layer 210 containing the Ru—Al alloy having high oxygen barrier characteristics is formed at the interface between the Cu wiring 208 and the cap layer 209 by heat generated during the formation of the Ru film for the cap layer 209 or by separate heat treatment, the upper interlayer insulating film can be formed without forming the dielectric cap. Accordingly, the effective dielectric constant of the wiring structure can be reduced.

Moreover, since the Cu—Al alloy is used for the Cu wiring 208, Al as an alloy component is segregated at grain boundaries of Cu. Hence, the electromigration resistance can be further improved.

After the Ru liner film 205 having high wettability to Cu is formed, the Cu alloy film 206 is formed by the PVD to fill the trench and the via. Therefore, good fillability can be obtained without forming a void as in the case of performing Cu plating.

Among the above series of processes, the step 2 of forming the barrier film 204, the step 3 of forming the Ru liner film 205, the step 4 of forming the Cu alloy film 206, and the step 5 of forming the additional layer 207 are preferably performed consecutively in vacuum without being exposed to the atmosphere. However, the exposure to the atmosphere may occur between the above steps.

<Film Forming System Suitable for Implementing an Embodiment of the Present Invention>

Figure 4:
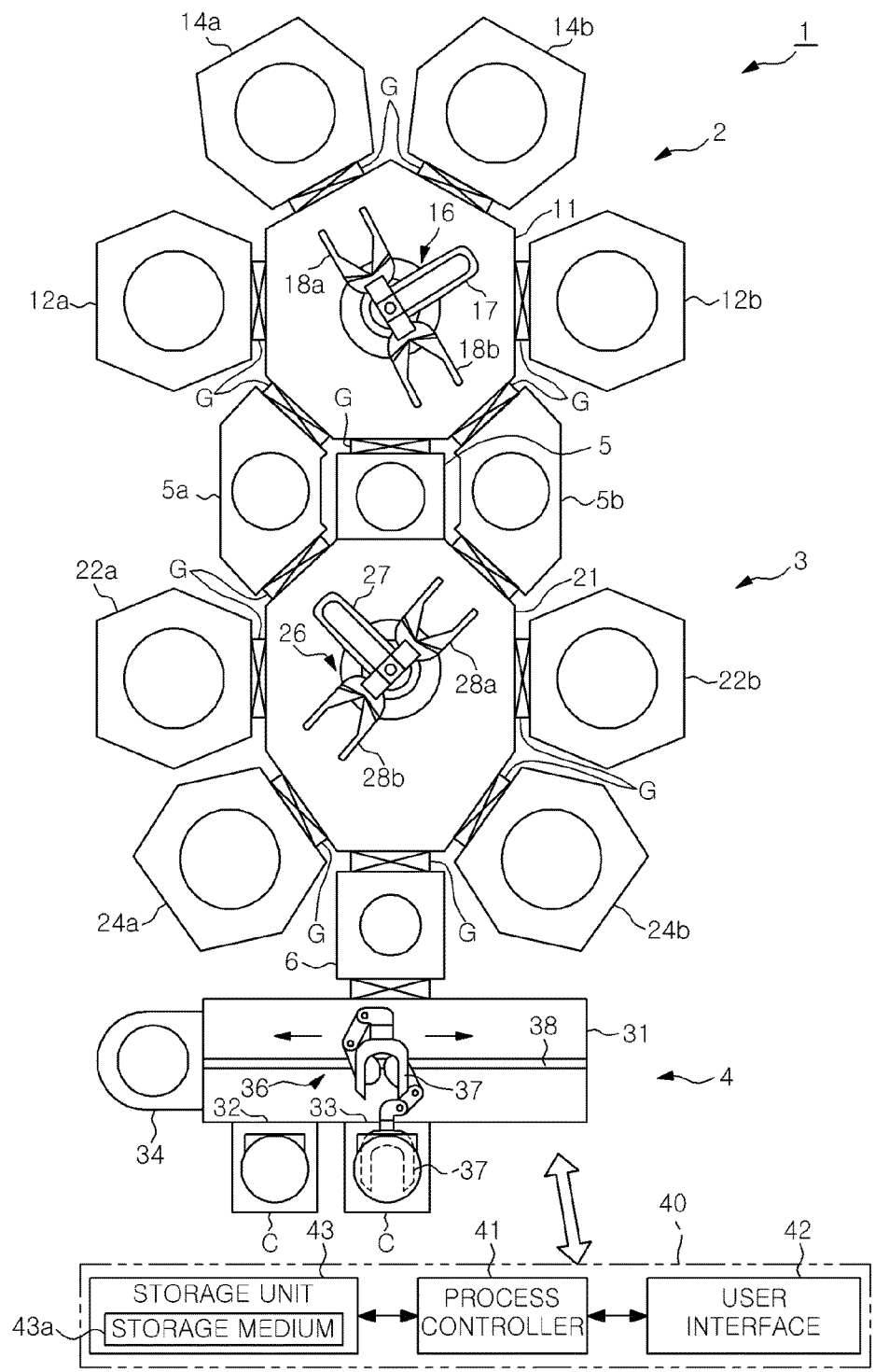
FIG. 4 is a top view showing an example of a multi-chamber type film forming system suitable for implementing the Cu wiring structure forming method in accordance with the embodiment of the present invention.

Hereinafter, a film forming system suitable for implementing the Cu wiring forming method in accordance with an embodiment of the present invention will be described. FIG. 4 is a top view showing an example of a multi-chamber type film forming system suitable for implementing the Cu wiring forming method in accordance with the embodiment of the present invention.

A film forming system 1 includes a first processing unit 2 for forming a barrier film, a Ru liner film, and a Ru film as a cap layer; a second processing unit 3 for forming a pure Cu film and a Cu alloy film; and a loading/unloading unit 4. The film forming system 1 is provided for use in a Cu wiring formation on a wafer W, and it particularly provided to perform processes up to the formation of the additional layer and the formation of the cap layer in the above embodiment.

The first processing unit 2 has a first vacuum transfer chamber 11 having a heptagonal shape when seen from the top, and two barrier film forming apparatuses 12a and 12b and two Ru film forming apparatuses 14a and 14b which are connected to walls corresponding to four sides of the first vacuum transfer chamber 11. The barrier film forming apparatus 12a and the Ru film forming apparatus 14a are disposed in line symmetry with the barrier film forming apparatus 12b and the Ru film forming apparatus 14b.

Degas chambers 5a and 5b each for performing a degas process on the wafer W are connected to walls corresponding to another two sides of the first vacuum transfer chamber 11. Further, a delivery chamber 5 through which the wafer W is transferred between the first vacuum transfer chamber 11 and a second vacuum transfer chamber 21 to be described later is connected to a wall corresponding to the other side of the first vacuum transfer chamber 1 between the degas chambers 5a and 5b of the first vacuum transfer chamber 11.

The barrier film forming apparatuses 12a and 12b, the Ru film forming apparatuses 14a and 14b, the degas chambers 5a and 5b, and the delivery chamber 5 are connected to the respective sides of the first vacuum transfer chamber 11 via gate valves G. They communicate with the first vacuum transfer chamber 11 by opening the corresponding gate valves G and are isolated from the first vacuum transfer chamber 11 by closing the corresponding gate valves G.

The inside of the first vacuum transfer chamber 11 is maintained at a predetermined vacuum atmosphere. Provided in the first vacuum transfer chamber 11 is a first transfer mechanism 16 for loading and unloading the wafer W into and from the barrier film forming apparatuses 12a and 12b, the Ru film forming units 14a and 14b, the degas chambers 5a and 5b, and the delivery chamber 5. The first transfer mechanism 16 is disposed substantially at the center of the first vacuum transfer chamber 11 and has a rotatable and extensible/contractible portion 17. The rotatable and extensible/contractible portion 17 has two support arms 18a and 18b for supporting the wafer W at leading ends thereof. The two support arms 18a and 18b are attached to the rotatable and extensible/contractible portion 17 to be directed in the opposite directions.

The second processing unit 3 includes: a second vacuum transfer chamber 21 having an octagonal shape when seen from the top; two Cu alloy film forming apparatuses 22a and 22b connected to walls corresponding to two opposite sides of the second vacuum transfer chamber 21, each for forming a Cu—Al alloy film; and two Cu film forming apparatuses 24a and 24b connected to walls corresponding to another two corresponding sides of the second vacuum transfer chamber 21, each for forming a pure Cu film or a Cu alloy film for the additional layer. When the additional layer made of the Cu—Al alloy is formed in the Cu alloy film forming apparatuses 22a and 22b, the Cu film forming apparatuses 24a 24b become unnecessary.

The degas chambers 5a and 5b are connected to walls corresponding to another two sides of the second vacuum transfer chamber 21 which face the first processing unit 2, and the delivery chamber 5 is connected to a wall corresponding to a side of the second vacuum transfer chamber 21 between the degas chambers 5a and 5b. In other words, the delivery chamber 5 and the degas chambers 5a and 5b are provided between the first vacuum transfer chamber 11 and the second vacuum transfer chamber 21, and the degas chambers 5a and 5b are disposed at both sides of the delivery chamber 5. Moreover, a load-lock chamber 6 that allows atmospheric transfer and vacuum transfer is connected to a wall corresponding to a side of the second vacuum transfer chamber 21 which faces the loading/unloading unit 4.

The Cu alloy film forming apparatuses 22a and 22b, the Cu film forming apparatuses 24a and 24b, the degas chambers 5a and 5b, and the load-lock chamber 6 are connected to the respective sides of the second vacuum transfer chamber 21 via gate valves G. They communicate with the second vacuum transfer chamber 21 by opening the corresponding valves and are isolated from the second vacuum transfer chamber 21 by closing the corresponding gate valves G. The delivery chamber 5 is connected to the second transfer chamber 21 without providing a gate valve therebetween.

The inside of the second vacuum transfer chamber 21 is maintained at a predetermined vacuum atmosphere. Provided in the second vacuum transfer chamber 21 is a second transfer mechanism 26 for loading and unloading the wafer W into and from the Cu alloy film forming apparatuses 22a and 22b, the Cu film forming apparatuses 24a and 24b, the degas chambers 5a and 5b, the load-lock chamber 6 and the delivery chamber 5. The second transfer mechanism 26 is disposed substantially at the center of the second vacuum transfer chamber 21 and has a rotatable and extensible/contractible portion 27. The rotatable and extensible/contractible portion 27 has two support arms 28a and 28b for supporting the wafer W at leading ends thereof. The two support arms 28a and 28b are attached to the rotatable and extensible/contractible portion 27 to be directed in the opposite directions.

The loading/unloading unit 4 is provided at an opposite side to the second processing unit 3 with the load-lock chamber 6 therebetween. The loading/unloading unit 4 has an atmospheric transfer chamber 31 connected to the load-lock chamber 6. A gate valve G is provided at a wall between the load-lock chamber 6 and the atmospheric transfer chamber 31. Provided at a wall of the atmospheric transfer chamber 31 opposite to the wall connected to the load-lock chamber 6 are two connection ports 32 and 33 each for connecting carriers C accommodating therein wafers W as target substrates. Each of the connection ports 32 and 33 is provided with a shutter (not shown). When the carrier C that is either empty or accommodates therein wafers W is directly mounted in the connection ports 32 and 33, the shutter is opened and the inner space of the carrier C communicates with that of the atmospheric transfer chamber 31 while preventing intrusion of air from outside.

Further, an alignment chamber 34 is provided at a side surface of the atmospheric transfer chamber 31, and the position of the wafer W is aligned therein. Provided in the atmospheric transfer chamber 31 is an atmospheric transfer mechanism 36 for loading and unloading the wafer W into and from the carrier C and the load-lock chamber 6. The atmospheric transfer mechanism 36 has two multi-joint arms and can move on a rail 38 along the arrangement direction of the carriers C. Therefore, the atmospheric transfer mechanism 36 transfers wafers W while mounting the wafer W on hands 37 provided at leading ends of the respective arms.

The film forming system 1 includes a controller 40 configured to control the respective components of the film forming system 1. The controller 40 includes a process controller 41 having a microprocessor (computer) for controlling the respective components of the film forming system 1, a user interface 42 and a storage unit 43. The user interface 42 includes a keyboard through which an operator inputs a command to manage the film forming system 1, a display for visually displaying the operational states of the film forming system 1, and the like. The storage unit 43 stores therein control programs to be used in realizing various processes performed in the film forming system 1 under the control of the process controller 41, and programs, i.e., processing recipes, to be used in controlling the respective components of the processing apparatuses to carry out processes under processing conditions and various data. The user interface 42 and the storage unit 43 are connected to the process controller 41.

The recipes are stored in a storage medium 43a in the storage unit 43. The storage medium 43a may be a hard disk or a portable medium such as a CD-ROM, a DVD, a flash memory or the like. Alternatively, the recipes may be suitably transmitted from other devices via, e.g., a dedicated transmission line If necessary, a predetermined recipe is read out from the storage unit 43 under an instruction from the user interface 42 and is executed by the process controller 41. Accordingly, a desired process is performed in the film forming system 1 under the control of the process controller 41.

In such a film forming system 1, the wafer W having trenches and holes in a predetermined pattern is unloaded from the carrier C and loaded into the load-lock chamber 6 by the atmospheric transfer mechanism 36. After the pressure in the load-lock chamber 6 is decreased to a vacuum level substantially equivalent to that in the second vacuum transfer chamber 21, the wafer W is unloaded from the load-lock chamber 6 to be loaded into the degas chamber 5a or 5b through the second vacuum transfer chamber 21 by the second transfer mechanism 26. Thus, the wafer W is subjected to the degas process.

Thereafter, the wafer W is unloaded from the degas chamber 5a or 5b and loaded into the barrier film forming apparatus 12a or 12b through the first vacuum transfer chamber 11 by the first transfer mechanism 16. Thus, the barrier film as described above is formed.

After the barrier film is formed, the wafer W is unloaded from the barrier film forming apparatus 12a or 12b to be loaded into the Ru film forming apparatus 14a or 14b by the first transfer mechanism 16. Thus, the Ru liner film as described above is formed.

After the Ru liner film is formed, the wafer W is unloaded from the Ru film forming apparatus 14a or 14b and transferred into the delivery chamber 5 by the first transfer mechanism 16. Next, the wafer W is unloaded from the delivery chamber 5 to be loaded into the Cu alloy film forming apparatus 22a or 22b through the second vacuum transfer chamber 21 by the second transfer mechanism 26. Thus, the Cu—Al alloy film as described above is formed. Thereafter, the additional layer is formed on the Cu alloy film. The formation of the additional layer may be carried out by consecutively forming the same Cu alloy film in the same Cu alloy film forming apparatus 22a or 22b. Alternatively, the wafer W is unloaded from the Cu alloy film forming apparatus 22a or 22b to be loaded into the Cu film forming apparatus 24a or 24b by the second transfer mechanism 26, and the formation of the additional layer may be carried out by forming a pure Cu film or a Cu alloy film on the wafer W in the Cu film forming apparatus 24a or 24b.

After the additional layer is formed, the wafer W is transferred to the load-lock chamber 6. After the pressure in the load-lock chamber 6 is returned to the atmospheric pressure, the wafer W having the Cu film is unloaded and returned to the carrier C by the atmospheric transfer mechanism 36. Such processes are repeated for the number of wafers W in the carrier.

Next, the carrier C is unloaded from the film forming system 1 and the wafer W in the carrier C is transferred to another apparatus (not shown) such that annealing or CMP is carried out on the wafer W. Thereafter, the carrier C is returned to the film forming system 1, and the wafer W in the carrier C is transferred to the Ru film forming apparatus 14a or 14b such that a cap layer made of a Ru film is formed on the wafer W in the Ru film forming apparatus 14a or 14b.

In accordance with the film forming system 1, the barrier film, the liner film, the Cu alloy film, and the additional layer are formed in the vacuum atmosphere without being exposed to the atmosphere. Accordingly, oxidation at the interface of the films can be prevented, and a high-performance Cu wiring can be obtained.

In the case of forming the additional layer by the Cu plating, the wafer W is unloaded from the film forming system 1 after the Cu alloy film is formed.

Hereinafter, there will be described examples of apparatuses installed at the film forming system.

<Cu Film Forming Apparatus>

First, the Cu alloy film forming apparatus 22a (22b) for use in forming a Cu alloy film will be described.

Figure 5:
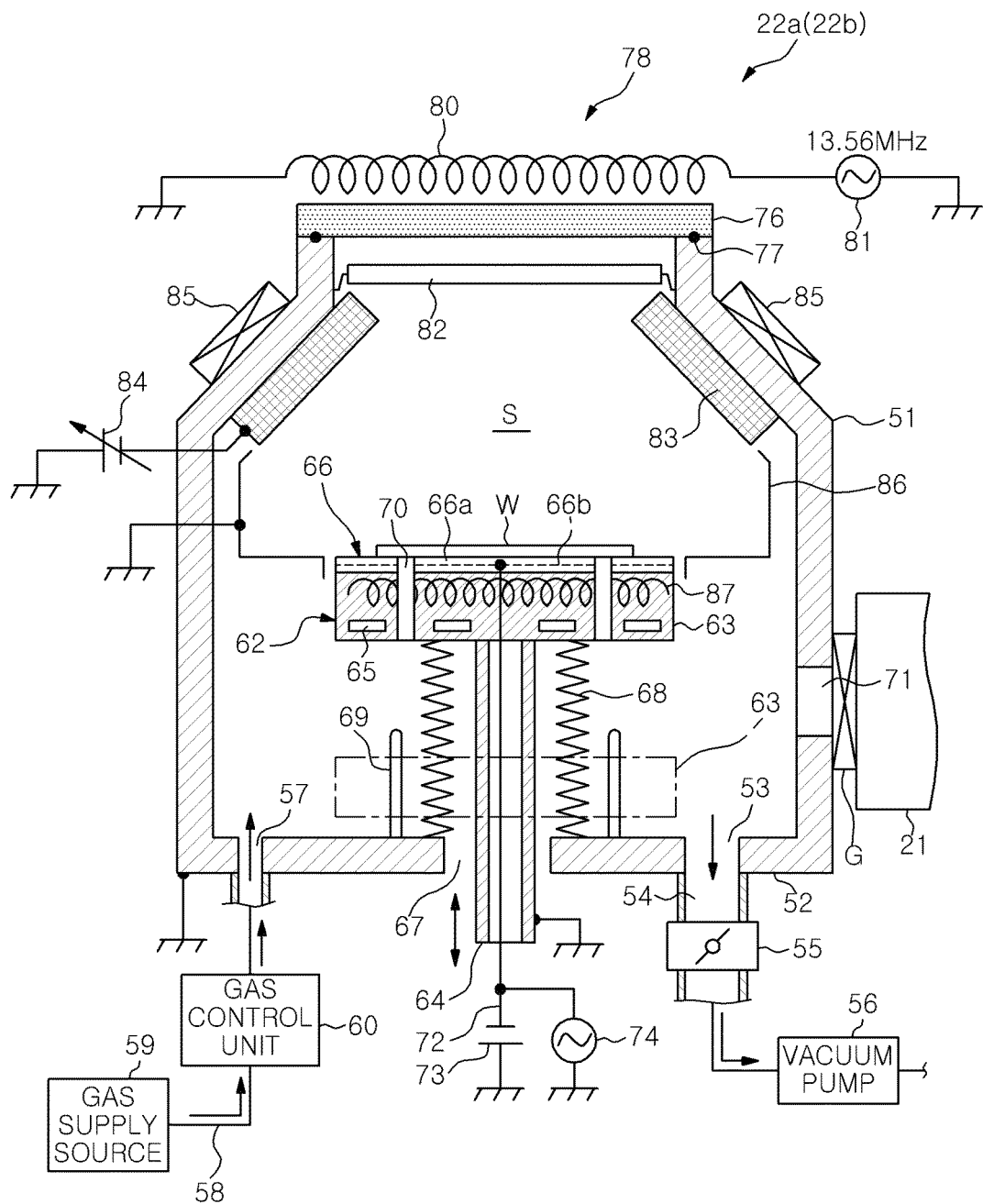
FIG. 5 is a cross sectional view showing a Cu alloy film forming apparatus for use in forming a Cu alloy film which is installed in the film forming system shown in FIG. 4.

FIG. 5 is a cross sectional view showing an example of the Cu alloy film forming apparatus. Here, an inductively coupled plasma (ICP) type plasma sputtering apparatus that is an iPVD apparatus will be described as an example of the Cu alloy film forming apparatus.

As shown in FIG. 5, the Cu alloy film forming apparatus 22a (22b) includes a cylindrical processing chamber 51 made of, e.g., aluminum or the like. The processing chamber 51 is grounded, and a gas exhaust port 53 is provided at a bottom portion 52 thereof. A gas exhaust line 54 is connected to the gas exhaust port 53. A throttle valve 55 and a vacuum pump 56 for controlling a pressure are connected to the gas exhaust line 54, and thus the inside of the processing chamber 51 can be evacuated to vacuum. Further, a gas inlet port 57 for introducing a predetermined gas into the processing chamber 51 is provided at the bottom portion 52 of the processing chamber 51. The gas inlet port 57 is connected to a gas supply line 58, and the gas supply line 58 is connected to a gas supply source 59 for supplying a rare gas serving as a plasma excitation gas, e.g., Ar gas, or another required gas, e.g., $N_2$ gas or the like. The gas supply line 58 is provided with a gas control unit 60 having a gas flow rate controller, a valve and the like.

Provided in the processing chamber 51 is a mounting mechanism 62 for mounting thereon a wafer W as a target substrate. The mounting mechanism 62 has a circular plate-shaped mounting table 63, and a hollow cylindrical column 64, which is grounded, for supporting the mounting table 63.

The mounting table 63 is made of a conductive material, e.g., an aluminum alloy or the like, and is grounded via the column 64. The mounting table 63 has therein a cooling jacket 65 through which a coolant is supplied via a coolant path (not shown). Further, in the mounting table 63, a resistance heater 87 coated with an insulating material is provided above the cooling jacket 65. The resistance heater 87 is electrically powered by a power supply (not shown). The mounting table 63 is provided with a thermocouple (not shown). A temperature of the wafer can be controlled to a predetermined level by controlling the supply of the coolant to the cooling jacket 65 and the supply of power to the resistance heater 87 based on the temperature detected by the thermocouple.

Provided on the top surface of the mounting table 63 is a thin circular plate-shaped electrostatic chuck 66 in which an electrode 66b is embedded in a dielectric member 66a made of, e.g., alumina or the like. Accordingly, the wafer W can be electrostatically attracted and held by electrostatic force. The lower portion of the column 64 extends downward through an insertion through hole 67 formed at the center of the bottom portion 52 of the processing chamber 51. The column 64 is vertically movable by an elevation unit (not shown), so that the entire mounting mechanism 62 is vertically moved.

An extensible/contractible metal bellows 68 is provided to surround the column 64. The metal bellows 68 has an upper end hermetically attached to the bottom surface of the mounting table 63 and a lower end hermetically attached to the top surface of the bottom portion 52 of the processing chamber 51. Accordingly, the mounting mechanism can be vertically moved while maintaining the airtightness in the processing chamber 51.

A plurality of, e.g., three (only two are shown in FIG. 5) support pins 69 is uprightly mounted on the bottom portion 52 toward the up side, and pin insertion through holes 70 are formed in the mounting table 63 so as to correspond to the support pins 69. Therefore, when the mounting table 63 is lowered, the upper end portions of the support pins 69 pass through the pin insertion through holes and receive the wafer W, so that the wafer W is transferred to a transfer arm (not shown), which comes from outside. Therefore, a loading/unloading opening 71 through which the transfer arm is moves in and out is provided at a lower sidewall of the processing chamber 51, and an openable/closeable gate valve G is provided at the loading/unloading opening 71. The second vacuum transfer chamber 21 is provided on the opposite side of the gate valve G to the processing chamber 51.

A power supply 73 for the electrostatic chuck is connected to the electrode 66b of the electrostatic chuck 66 through a power supply line 72. By applying a DC voltage from the power supply 73 to the electrode 66b, the wafer W is electrostatically attracted and held by electrostatic force. Further, a high frequency bias power supply 74 is connected to the power supply line 72, so that a high frequency bias power is applied to the electrode 66b of the electrostatic chuck 66 through the power supply line 72 to apply a bias power to the wafer W. The frequency of the high frequency power is preferably in a range from 400 kHz to 60 MHz, e.g., about 13.56 MHz.

A high frequency transmitting plate 76 made of a dielectric material, e.g., alumina or the like, is hermitically provided at the ceiling portion of the processing chamber 51 through a seal member 77 such as an O-ring or the like. Further, a plasma generating source 78, for generating a plasma from a rare gas as a plasma excitation gas, e.g., Ar gas, in a processing space S of the processing chamber 51, is provided above the transmission plate 76. The plasma excitation gas may be another rare gas, e.g., He, Ne, Kr or the like, other than Ar.

The plasma generating source 78 has an induction coil 80 disposed so as to correspond to the transmission plate 76. A high frequency power supply 81 having a high frequency of, e.g., 13.56 MHz, for plasma generation is connected to the induction coil 80. Accordingly, a high frequency power is introduced into the processing space S through the transmission plate 76, and an induced electric field is formed.

Moreover, a baffle plate 82 made of e.g. aluminum, is provided directly under the transmission plate 76 to diffuse the introduced high frequency power. A target 83 is disposed below the baffle plate 82 to surround the upper region of the processing space S. The target 83 is made of a Cu—Al alloy having an annular shape with an inwardly upwardly inclined cross section (truncated cone shape), for example. A variable-voltage DC power supply 84 is connected to the target 83 to apply a DC power for attracting Ar ions. Alternatively, an AC power supply may be used instead of the DC power supply.

Further, a magnet 85 is provided at an outer circumferential side of the target 83 to apply a magnetic field to the target 83. The target 83 is sputtered by Ar ions in the plasma, so that metal atoms or metal atom groups are emitted from the target 83 and they are mostly ionized while passing through the plasma.

In addition, a cylindrical protection cover member 86 made of, e.g., aluminum or copper, is provided below the target 83 to surround the processing space S. The protection cover member 86 is grounded, and a lower portion thereof is bent inward so as to be positioned near the side portion of the mounting table 63. Thus, an inner end of the protection cover member 86 is disposed to surround the outer peripheral side of the mounting table 63.

The respective components of the Cu alloy film forming apparatus are controlled by the aforementioned controller 40.

In the Cu alloy film forming apparatus configured as described above, the wafer W is loaded into the processing chamber 51 shown in FIG. 5 and mounted on the mounting table 63. Then, the wafer W is electrostatically attracted to and held on the electrostatic chuck 66, and the following processes are carried out under the control of the controller 40. At this time, the temperature of the mounting table 63 is controlled by controlling the supply of the coolant to the cooling jacket or the supply of the power to the resistance heater 87 based on the temperature detected by the thermocouple (not shown).

In the film forming process, first, the processing chamber 51 is set to be maintained at a predetermined vacuum state by operating the vacuum pump 56. Then, Ar gas is supplied into the processing chamber 51 at a predetermined flow rate by controlling the gas control unit 60 while the processing chamber 51 is maintained at a predetermined vacuum level by controlling the throttle valve 55. Next, a DC power is applied to the target 83 from the variable DC power supply 84, and a high frequency power (plasma power) is supplied to the induction coil 80 from the high frequency power supply 81 of the plasma generating source 78. Further, a predetermined high frequency bias power is supplied from the high frequency bias power supply 74 to the electrode 66b of the electrostatic chuck 66.

Hence, in the processing chamber 51, an Ar plasma is generated by the high frequency power supplied to the induction coil 80 and thus Ar ions are generated. These ions are attracted toward the target 83 by the DC voltage applied to the target 83 and collide with the target 83. The target 83 is sputtered to emit particles. At this time, the amount of particles emitted from the target 83 is optimally controlled by the DC voltage applied to the target 83.

The particles from the sputtered target 83 are mostly ionized while passing through the plasma. Here, the particles emitted from the target 83 are scattered downward in a state where the ionized particles and electrically neutral atoms are mixed. Particularly, when the pressure in the processing chamber 51 is increased to a certain level, a plasma density is increased, so that the particles can be ionized with high efficiency. The ionization rate at this time is controlled by the high frequency power supplied from the high frequency power supply 81.

When the ions are introduced into an ion sheath region formed on the wafer W with a thickness of about a few mm by the high frequency bias power applied from the high frequency bias power supply 74 to the electrode 66b of the electrostatic chuck 66, the ions are rapidly attracted with strong directivity toward the wafer W and deposited on the wafer W. As a consequence, the Cu alloy film made of a Cu—Al alloy is formed.

At this time, the wafer temperature is set to be maintained at a high level in a range from 65° C. to 350° C. and more preferably in a range from 230° C. to 300° C., and the bias power applied from the high frequency bias power supply 74 to the electrode 66b of the electrostatic chuck 66 is controlled. With such control, the formation of the Cu alloy film and the etching using Ar are controlled to improve the mobility of the Cu—Al alloy. As a result, the Cu—Al alloy can be filled with good fillability even in a trench or a hole having a small opening. Specifically, on the assumption that the Cu alloy film forming amount (film forming rate) is $T_D$ and the amount of etching (etching rate) using ions of the plasma generation gas is $T_E$, it is preferable to control the bias power to satisfy the correlation of $0 \leq T_E/T_D < 1$ and further $0 < T_E/T_D < 1$.

In view of ensuring good fillability, the pressure in the processing chamber 51 (processing pressure) is preferably set in a range from 0.133 Pa to 13.3 Pa (from 1 mTorr to 100 mTorr) and more preferably set in a range from 4.66 Pa to 12.0 Pa (from 35 mTorr to 90 mTorr). The DC power supplied to the target is preferably set in a range from 4 kW to 12 kW and more preferably set in a range from 6 kW to 10 kW.

When the opening of the trench or the hole is large, the film formation can be carried out by the conventional PVD such as conventional sputtering, ion plating or the like without being limited to the iPVD.

<Cu Film Forming Apparatus>

An apparatus having the same configuration as that of the Cu alloy film forming apparatus 22a (22b) shown in FIG. 5 can be basically used as the Cu film forming apparatus 24a (24b). In the case of forming a pure Cu film, pure Cu is used for the target 83. When the fillability is not a considerable matter, the conventional PVD such as the conventional sputtering, the ion plating or the like may be used without being limited to the iPVD.

<Barrier Film Forming Apparatus>

The barrier film forming apparatus 12a (12b) uses a film forming apparatus having the same configuration as that of the film forming apparatus shown in FIG. 5. At this time, a barrier film is formed by plasma sputtering while using a material of the barrier film as the target 83. The film formation method is not limited to the plasma sputtering and may be other PVD such as the conventional sputtering, the ion plating or the like, the chemical vapor deposition or the atomic layer deposition, or the plasma CVD or the plasma ALD. In view of reduction of impurities, the PVD is preferred.

<Ru Film Forming Apparatus>

Figure 6:
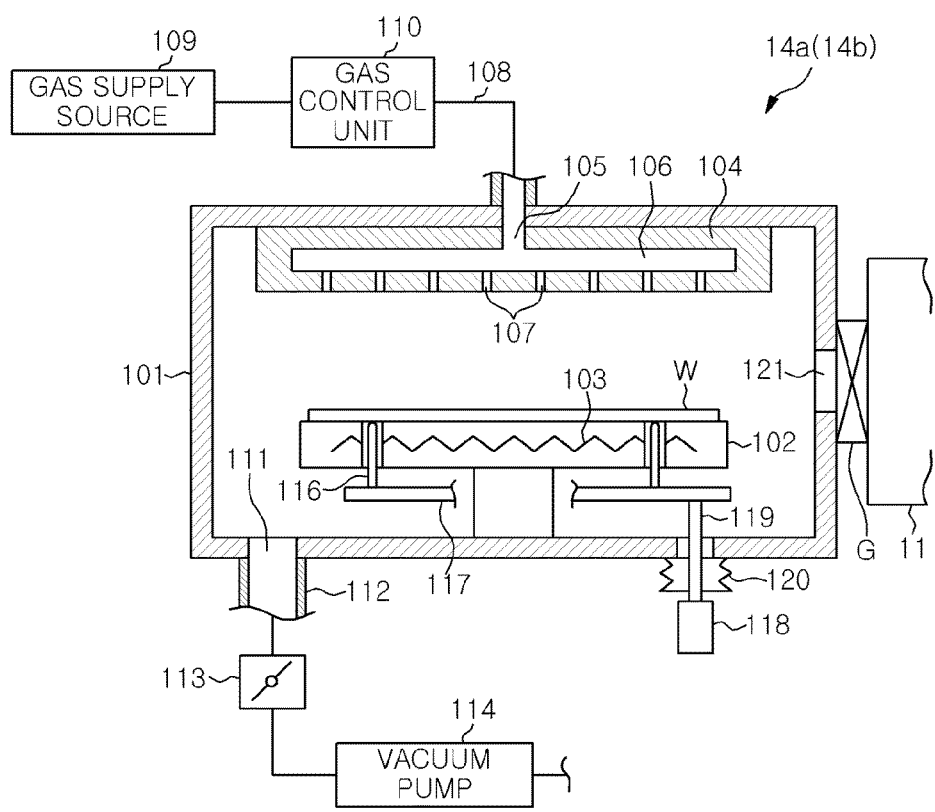
FIG. 6 is a cross sectional view showing a Ru film forming apparatus for use in forming a Ru film which is installed in the film forming system shown in FIG. 4.

Hereinafter, the Ru film forming apparatus 14a (14b) for use in forming the Ru liner film and the Ru film forming the cap layer will be described. The Ru film may be preferably formed by a thermal CVD. FIG. 6 is a cross sectional view showing an example of the Ru film forming apparatus for forming the Ru film by the thermal CVD.

As shown in FIG. 6, the Ru film forming apparatus 14a (14b) includes a cylindrical processing chamber 101 made of, e.g., aluminum or the like. The processing chamber 101 has therein a mounting table 102 made of ceramic, e.g., AlN, for mounting thereon the wafer W. The mounting table 102 has therein a heater 103. The heater 103 generates heat by power supplied from a heater supply (not shown).

A shower head 104 is provided at the ceiling wall of the processing chamber 101 so as to face the mounting table 102. Through the shower head 104, a purge gas or a processing gas for forming the Ru film is introduced into the processing chamber 101 in the form of shower. The shower head 104 has a gas inlet port 105 at an upper portion thereof and a gas diffusion space 106 therein. A plurality of gas injection openings 107 is formed in the bottom of the shower head 104. A gas supply line 108 is connected to the gas inlet port 105, and a gas supply source 109 is connected to the gas supply line 10 to supply the purge gas or the processing gas for forming the Ru film. Further, a gas control unit 110 including a gas flow rate controller, a valve or the like is disposed on the gas supply line 108. As described above, ruthenium carbonyl ($Ru_3(CO)_{12}$) may be preferably used as a Ru film forming gas. The Ru film can be formed by thermally decomposing ruthenium carbonyl.

A gas exhaust port 111 is provided at the bottom portion of the processing chamber 101, and a gas exhaust line 112 is connected to the gas exhaust port 111. A throttle valve 113 and a vacuum pump 114 which perform pressure control are connected to the gas exhaust line 112, so that the processing chamber 101 can be exhausted to vacuum.

Three wafer support pins 116 (only two pins are shown) for transferring a wafer are provided at the mounting table 102 such that they can protrude from and retreat into the surface of the mounting table 102. The wafer support pins 116 are fixed to a support plate 117. The wafer support pins 116 are vertically moved together with the support plate 117 by vertically moving a rod 119 by a driving unit 118 such as an air cylinder or the like. Reference numeral 120 denotes a bellows. A wafer loading/unloading port 121 is formed at a sidewall of the processing chamber 101, so that a wafer W can be loaded from and unloaded into the first vacuum transfer chamber 11 in a state where a gate valve G is opened.

In the Ru film forming apparatus 14a (14b), the gate valve G is opened and the wafer W is mounted on the mounting table 102. Then, the gate valve G is closed, and the processing chamber 101 is evacuated by the vacuum pump 114 so that the pressure in the processing chamber 101 is controlled to be maintained at a predetermined level. In a state where the wafer W is heated to a predetermined temperature through the mounting table 102 by the heater 103, a processing gas such as ruthenium carbonyl ($Ru_3(CO)_{12}$) or the like is introduced into the processing chamber 101 from the gas supply source 109 through the gas supply line 108 and the shower head 104. Accordingly, the processing gas reacts on the surface of the wafer W, and the Ru film can be formed on the wafer W.

The Ru film may be formed by using another film forming material other than ruthenium carbonyl, e.g., the aforementioned pentadienyl ruthenium compounds, together with a decomposition gas such as an $O_2$ gas.

The Ru film may be formed by the PVD. However, the CVD is preferable in view of ensuring good step coverage.

<Apparatus Used for Other Processes>

Although the processes up to the formation of the additional layer and the formation of the cap layer in the above embodiment can be carried out by the above-described film forming system 1, the post processes such as the annealing and the CMP may be performed on the wafer W unloaded from the film forming system 1 by using an annealing apparatus and a CMP apparatus. Further, the formation of the upper interlayer insulating film which is performed after the formation of the cap layer may be carried out by a separate film forming apparatus. These apparatuses may have general configurations. When these apparatuses and the film forming system 1 constitute the Cu wiring forming system and are controlled by a common controller having the same function as that of the controller 40, the method described in the above embodiment can be controlled by a single recipe.

<Test Example>

Hereinafter, a test example will be described.

Figure 7:
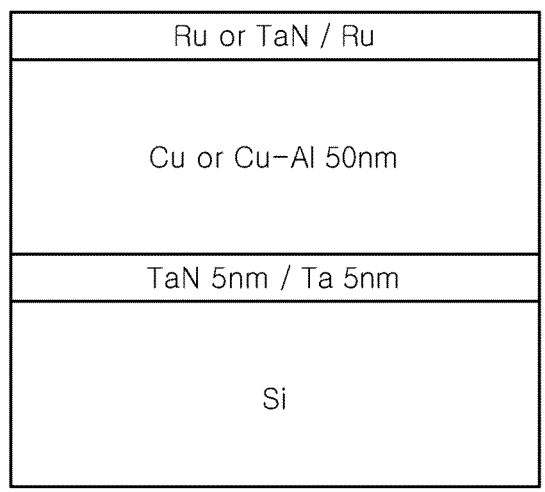
FIG. 7 is a schematic diagram showing a structure of a sample used in a test example for examining oxygen barrier characteristics.

Here, a plurality of samples was manufactured by sequentially forming, on a blanket wafer made of silicon, a TaN/Ta laminated layer (TaN: 5 nm, Ta: 5 nm) as a barrier film by the iPVD, a Cu film or a Cu-2 at. % Al alloy film with a thickness of 50 nm by the identical iPVD, and a TaN/Ru laminated film or a Ru film as a surface film with a thickness of 3 nm, as shown in FIG. 7. In a sample having the Ru film as the surface film, the surface film serves as the cap film of the Cu wiring. In a sample having the TaN/Ru laminated film as the surface film, the surface film serves as the barrier film and the Ru liner film of the Cu wiring.

In order to examine oxygen barrier characteristics, these samples were subjected to the annealing at a temperature of 180° C. for 2 hours in the atmosphere. When the surface film does not have oxygen barrier characteristics, oxygen in the atmosphere penetrates through the surface film during the annealing, which leads to the oxidization of Cu. Portions where Cu is oxidized are indicated in black dots in the film. However, when the surface film has oxygen barrier characteristics, oxygen does not penetrate through the surface film to reach the Cu film or the Cu—Al alloy film. Hence, Cu is not oxidized and black dots do not appear. For that reason, the presence of black dots was detected to evaluate the oxygen barrier characteristics by observing the Cu film or the Cu—Al alloy film through an optical microscope after the annealing.

Figure 8:
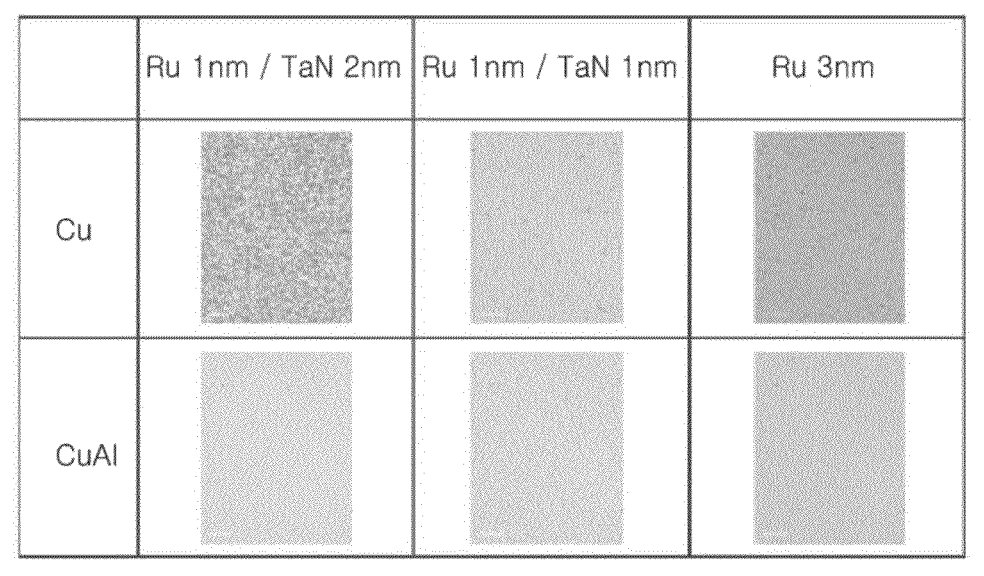

FIG. 8 shows a result of the test for examining the oxygen barrier characteristics. As shown in FIG. 8, in a sample using a Cu film to which Al was not added, a plurality of block dots were observed after the annealing under the atmosphere environment. This shows that the Cu film was oxidized due to insufficient barrier characteristics of the surface film. In the sample having as the surface film the TaN/Ru laminated film serving as the barrier film and the Ru liner film of the Cu wiring, the TaN film was considerably thin and, thus, the oxygen barrier characteristics were insufficient. On the other hand, in the sample using the Cu—Al alloy film, block dots were hardly observed after the annealing. In other words, the oxygen barrier characteristics were obtained when using the Cu—Al alloy film.

Al in the Cu—Al alloy is easily diffused toward Ru, so that an alloy (including an intermetallic compound), which includes Al in the Cu—Al alloy and Ru in the Ru film, is formed at the interface between the Cu—Al alloy film and the Ru film serving as the surface film. Such a Ru—Al alloy is considered to have oxygen barrier characteristics.

In other words, it was observed that oxygen barrier characteristics and Cu barrier characteristics were obtained by using the Cu—Al alloy film for the Cu wiring and the Ru film for the cap layer. In the case of using the Cu—Al alloy film, even in the sample having as the surface film the TaN/Ru laminated film serving as the barrier film and the Ru liner film of the Cu wiring, the oxygen barrier characteristics were improved due to the Ru—Al alloy formed at the interface between the Cu—Al alloy film and the Ru film. Moreover, a thinner barrier film can be obtained compared to the case of using the Cu film.

<Other Applications>

While the embodiment of the present invention has been described, the present invention may be variously modified without being limited to the above embodiment. For example, although the above embodiment has described the example in which the Cu—Al alloy is filled in the recess such as a trench or a hole by the PVD, an Al-containing Cu film mainly made of Cu and having, at least as a part thereof, a Cu—Al alloy may be filled in the recess, that is, the Al-containing Cu film includes Cu and the Cu—Al alloy, and the amount of Cu is greater than the amount of the Cu—Al alloy. It is not necessary to fully fill the recess with the Cu—Al alloy.

For example, after a Cu—Al alloy film is formed in the recess, a pure Cu film may be formed. Alternatively, after a pure Cu film is formed in the recess, a Cu—Al alloy may be formed only at an upper portion of the pure Cu film. In the former case, it is possible to form a Cu—Al alloy seed film by the CVD and then perform a Cu plating, or also possible to form a thin Cu—Al alloy film by the PVD and then form a pure Cu film by the PVD. In this case as well, Al in the Cu—Al alloy film is diffused into the pure Cu film, so that an interface having a Ru—Al alloy can be formed during the formation of the cap layer. In the latter case, a pure Cu film is filled in the recess by the PVD or plating, and Al is diffused to a top surface thereof, thereby forming a Cu—Al alloy at an upper portion of the pure Cu film. In this case as well, an interface having a Ru—Al alloy can be formed when the cap layer is formed. In this case, the improvement of the electromigration resistance is small due to the presence of Al at a grain boundary of Cu, but the electromigration resistance can be ensured by improved adhesivity of the Cu wiring. Moreover, the resistance of the Cu wiring can be further lowered.

The film forming system is not limited to the type shown in FIG. 4 and may employ a type in which all the film forming apparatuses are connected to a single transfer unit. Instead of the multi-chamber type system shown in FIG. 4, there may be employed a system in which some of a barrier film, a Ru liner film and a Cu alloy film are formed in the same film forming system and the other films are formed in separate apparatuses while being exposed to the atmosphere. Alternatively, the respective films may be formed in separate apparatuses while being exposed to the atmosphere.

The above embodiment has described the example in which the method of the present invention is applied to the wafer having a trench and a via (hole). However, the present invention may be applied to the case in which a wafer has only a trench and to the case in which a wafer has only a hole. Further, the present invention may be applied to the filling in devices of various structures such as a single damascene structure, a double damascene structure, a 3D mounting structure or the like. Further, although a semiconductor wafer is described as an example of a target substrate in the above embodiment, the semiconductor wafer may include a compound semiconductor such as GaAs, SiC, GaN or the like as well as a silicon. Further, the present invention may be applied to a glass substrate for use in a FPD (flat panel display) such as a liquid crystal display or the like, a ceramic substrate or the like without being limited to a semiconductor wafer.

In accordance with the embodiment of the present invention, the Ru film that is a metal cap having good adhesivity to the Cu wiring is formed for a cap layer on the Cu wiring, so that the electromigration resistance of the Cu wiring can be improved. Since the Ru film serves as the cap layer, the cap layer can be selectively formed only on the Cu wiring without any specific process. Further, the interface layer containing the Ru—Al alloy having good oxygen barrier characteristics is formed on the interface between the Cu wiring and the cap layer by heat generated during the formation of the Ru film or by a separate heat treatment. Therefore, the upper interlayer insulating film can be formed without forming the dielectric cap. As a consequence, the effective dielectric constant of the wiring structure can be lowered.

While the invention has been shown and described with respect to the embodiments, it will be understood by those skilled in the art that various changes and modifications may be made without departing from the scope of the invention as defined in the following claims.

What is claimed is:

1. A Cu wiring structure forming method, comprising:
providing a first insulating film having a recess on a substrate;
forming a barrier film serving as a Cu diffusion barrier at least on a surface of the recess of the first insulating film on a substrate;
filling the recess with an Al-containing Cu film;
forming an additional layer on the Al-containing Cu film;
forming a Cu wiring by planarization, in which the additional layer, the Al-containing Cu film and the barrier film outside the recess are removed;
forming a cap layer including a Ru film on the Cu wiring;
forming an interface layer containing a Ru—Al alloy at an interface between the Cu wiring and the cap layer by heat generated in forming the cap layer or by a heat treatment performed after forming the cap layer; and
forming a second insulating film on the cap layer.

2. The Cu wiring structure forming method of claim 1, wherein the Al-containing Cu film includes Cu and a Cu—Al alloy, and an amount of the Cu is greater than an amount of the Cu—Al alloy.

3. The Cu wiring structure forming method of claim 2, further comprising forming a Ru film after said forming the barrier film before said filling the recess with the Al-containing Cu film.

4. The Cu wiring structure forming method of claim 1, wherein the Al-containing Cu film is a Cu—Al alloy film.

5. The Cu wiring structure forming method of claim 4, further comprising providing an apparatus having a processing chamber where the substrate is accommodated, wherein the Cu—Al alloy film is formed by generating a plasma from a plasma generation gas in the processing chamber, scattering particles from a target made of a Cu—Al alloy, ionizing the particles scattered in the plasma, and attracting ions onto the substrate by applying a bias power to the substrate.

6. The Cu wiring structure forming method of claim 4, further comprising forming a Ru film after said forming the barrier film before said filling the recess with the Al-containing Cu film.

7. The Cu wiring structure forming method of claim 1, wherein said filling the recess with the Al-containing Cu film includes forming a Cu—Al alloy film in the recess and then forming a pure Cu film.

8. The Cu wiring structure forming method of claim 7, wherein the Cu—Al alloy film is formed by a physical vapor deposition (PVD), and the pure Cu film is formed by a plating or the PVD.

9. The Cu wiring structure forming method of claim 7, further comprising forming a Ru film after said forming the barrier film before said filling the recess with the Al-containing Cu film.

10. The Cu wiring structure forming method of claim 1, wherein said filling the recess with the Al-containing Cu film includes filling a pure Cu film in the recess and then forming a Cu—Al alloy at an upper portion of the pure Cu film.

11. The Cu wiring structure forming method of claim 10, wherein the Cu—Al alloy is formed at the upper portion of the pure Cu film by diffusing Al to the top surface of the pure Cu film.

12. The Cu wiring structure forming method of claim 10, further comprising forming a Ru film after said forming the barrier film before said filling the recess with the Al-containing Cu film.

13. The Cu wiring structure forming method of claim 1, further comprising forming a Ru film after said forming the barrier film before said filling the recess with the Al-containing Cu film.

14. The Cu wiring structure forming method of claim 13, wherein the Ru film is formed by a chemical vapor deposition.

15. The Cu wiring structure forming method of claim 1, wherein each of the first insulting film and the second insulating film is a Low-k film and serves as an interlayer insulating film.

16. The Cu wiring structure forming method of claim 1, wherein the planarization is carried out by a polishing process.

17. The Cu wiring structure forming method of claim 1, wherein the barrier film is selected from a group consisting of a Ti film, a TiN film, a Ta film, a TaN film, a Ta/TaN bilayered film, a TaCN film, a W film, a WN film, a WCN film, a Zr film, a ZrN film, a V film, a VN film, a Nb film and a NbN film.

18. A non-transitory computer-readable storage medium storing a program executed on a computer to control a Cu wiring forming system, wherein the program, when executed on the computer, controls the Cu wiring forming system to perform the Cu wiring structure forming method described in claim 1.

* * * * *